(12) United States Patent
Koskela et al.

(10) Patent No.: US 7,310,388 B2
(45) Date of Patent: Dec. 18, 2007

(54) DIRECT CONVERSION RECEIVER AND RECEIVING METHOD

(75) Inventors: Julius Koskela, Helsinki (FI); Jouko Lokio, Espoo (FI); Hans-Otto Scheck, Espoo (FI)

(73) Assignee: Nokia Corporation, Espoo (FI)

( * ) Notice: Subject to any disclaimer, the term of this patent is extended or adjusted under 35 U.S.C. 154(b) by 724 days.

(21) Appl. No.: 10/693,608

(22) Filed: Oct. 27, 2003

(65) Prior Publication Data

US 2005/0047528 A1 Mar. 3, 2005

(30) Foreign Application Priority Data

Aug. 25, 2003 (FI) ................................. 20031194

(51) Int. Cl.
*H03D 3/22* (2006.01)
*H03D 1/04* (2006.01)
(52) U.S. Cl. ....................... 375/329; 375/346
(58) Field of Classification Search ................ 375/329, 375/316, 260, 346; 455/68, 232.1, 67.11
See application file for complete search history.

(56) References Cited

U.S. PATENT DOCUMENTS

| 6,356,747 | B1 | 3/2002 | Miquel et al. | |
| 6,552,995 | B1 | 4/2003 | Nakada | |
| 6,690,735 | B1 * | 2/2004 | Maddiotto et al. | 375/260 |
| 2002/0127982 | A1 * | 9/2002 | Haapoja et al. | 455/130 |
| 2003/0072393 | A1 | 4/2003 | Gu | |
| 2004/0203472 | A1 * | 10/2004 | Chien | 455/68 |

FOREIGN PATENT DOCUMENTS

| EP | 0 948 128 A1 | 10/1999 |
| EP | 1 172 928 A2 | 1/2002 |
| EP | 1 241 779 A2 | 9/2002 |
| EP | 1 298 791 A1 | 4/2003 |

* cited by examiner

*Primary Examiner*—Khai Tran
(74) *Attorney, Agent, or Firm*—Squire, Sanders & Dempsey L.L.P.

(57) ABSTRACT

A direct conversion receiver includes a receiver for receiving a signal including multiple components at different receiving frequencies belonging to a frequency band. A mixer mixes the signal components into a base band signal comprising I- and Q branches. A converter converts the analog base band signal into a digital signal. The receiver includes a measuring unit for measuring power levels of the signal components in pairs, where one component in the pair belongs to an upper sideband of the frequency band and one component in the pair belongs to a lower sideband of the frequency band. An estimator estimates, when either the upper sideband component or the lower sideband component dominates in power over the component in the pair, a frequency-independent phase imbalance, a frequency-dependent phase imbalance and a gain imbalance, and a compensator compensates the estimated imbalances to at least one of the I- and Q-branch signals.

15 Claims, 3 Drawing Sheets

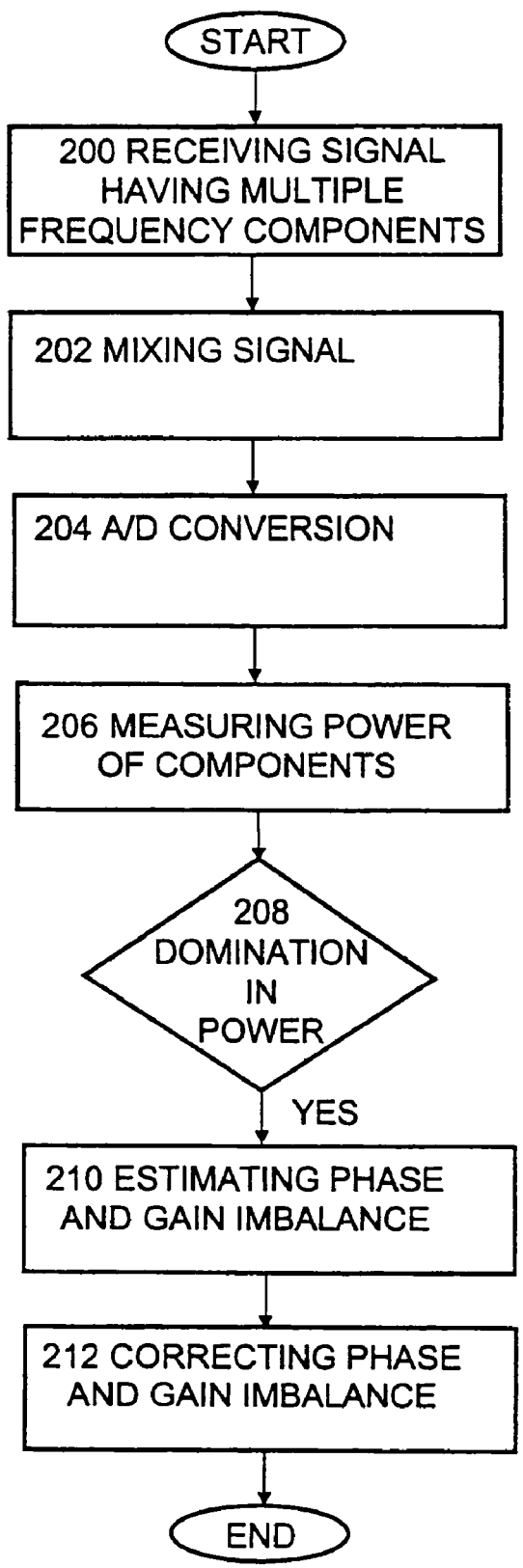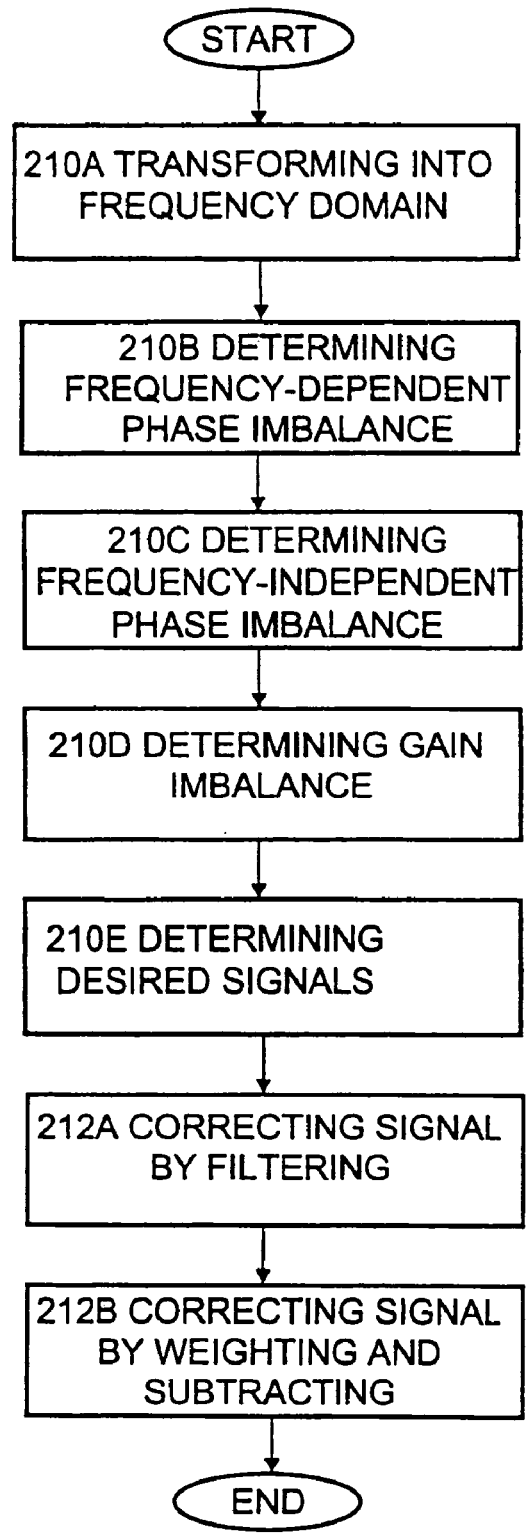
Fig. 2A
Fig. 2B

DIRECT CONVERSION RECEIVER AND RECEIVING METHOD

BACKGROUND OF THE INVENTION

1. Field of the Invention

The invention relates to a direct conversion receiver and a reception method in direct conversion receivers. The invention relates particularly to removal of IQ (In-phase/Quadrature) phase imbalance in direct conversion receivers.

2. Description of the Related Art

The use of digital wireless communication systems has recently been increasing. Systems of many different types have been introduced. For example, systems like Wireless LANs (Local Area Networks), UMTS (Universal Mobile Telecommunications System) and GSM (Global System for Mobile Communication) are gaining more attention and users are given more alternatives in wireless communication. To get customers interested in new services it is essential that the equipment needed in order to use the services should be priced correctly. Less expensive receivers having low power consumption are thus needed.

One solution to provide affordable receivers with low power consumption is to use a direct conversion analog front-end architecture in the receivers. In the direct conversion solution, a received RF signal is mixed directly into the base band and thereafter analog-to-digital converted. For the mixing process, two signals, a sine and a cosine signal, have to be provided. Because of technical reasons the precise orthogonality of both sinusoidal signals cannot be guaranteed; therefore an angle $\phi \neq 90°$ is measurable between the sine and cosine functions. This phenomenon is commonly called IQ phase imbalance.

Analog base band components, such as low-pass filters and base-band amplifiers are installed twice: one component for the I-branch and one component for the Q-branch. Because of manufacturing tolerances, or temperature influences, each component of a certain functional type may behave slightly differently compared with its counterpart on the other branch. The conjunction of frequency dependent base band devices with the constant IQ phase imbalance imperfections result in frequency selective IQ phase imbalance inaccuracies.

Because of the IQ imbalance, so-called image signals are created at image frequencies of the actual signals, causing IQ-cross talk. FIGS. 1A and 1B show an example of the reception of a multi-carrier signal under the effect of IQ imbalance. As shown in FIG. 1A, the received signal contains six carriers 100 to 114, out of which carriers 100 to 104 form the lower sideband and carriers 110 to 114 above the local oscillator (LO) frequency form the upper sideband. FIG. 1B shows how the signal spectrum of FIG. 1A may look after frequency conversion to base band when sufficient image rejection is not performed. In the situation shown by FIG. 1B, image signals 110A-114A overlap the converted signals 100A-104A.

For example, in case of two carriers with significant power difference in the received signal, an image of the first component appears in the second component and vice versa. The strengths of the image signals depend on the degree of the imbalance and on the strengths of the signals. Weak image signals are usually not a problem when the signal components have approximately the same magnitude. However, problems may arise when one signal is strong and the other signal is weak. If the image of the strong signal is stronger than the weak signal, or even comparable to it, the reception of the weak signal is degraded or even entirely prevented. In the example of FIG. 1B, image signal 110A of signal 110 is stronger than the weak signal 104A which may prevent reception of signal 104A.

SUMMARY OF THE INVENTION

According to one embodiment, the invention provides a receiving method and a receiver so that IQ imbalance is reduced thus enhancing reception of weak signal components. According to the invention, there is provided a receiving method in a direct conversion receiver. The method includes the steps of receiving, mixing, converting, measuring, estimating, and compensating. The steps of receiving receives a signal including multiple components at different receiving frequencies belonging to a frequency band. The mixing step mixes each of the received signal components into a corresponding base band signal including I- and Q branches. The converting step converts the analog base band signal into a digital signal. The method also measures power levels of the signal components in the digital signal in pairs, where one component in the pair belongs to an upper sideband of the frequency band and one component in the pair belongs to a lower sideband of the frequency band. The method estimates, when either the upper sideband component or the lower sideband component dominates in power over the other component in the pair, a frequency-independent phase imbalance, a frequency-dependent phase imbalance and a gain imbalance. The method compensates the estimated frequency-independent phase imbalance, the frequency-dependent phase imbalance and the gain imbalance to at least one of the I- and Q-branch signals.

The invention also relates to a direct conversion receiver including a receiving mechanism, a mixing mechanism converting mechanism, measuring mechanism, estimating mechanism, and compensating mechanism. The receiving mechanism receives a signal including multiple components at different receiving frequencies belonging to a frequency band. The mixing mechanism mixes each of the received signal components into a corresponding base band signal including I- and Q branches. The converting mechanism converts the analog base band signal into a digital signal. The receiver includes the measuring mechanism for measuring power levels of the signal components in the digital signal in pairs, where one component in the pair belongs to an upper sideband of the frequency band and one component in the pair belongs to a lower sideband of the frequency band. The receiver includes the estimating mechanism for estimating, when either the upper sideband component or the lower sideband component dominates in power over the component in the pair, a frequency-independent phase imbalance, a frequency-dependent phase imbalance and a gain imbalance. The receiver includes compensating mechanism for compensating the estimated frequency-independent phase imbalance, the frequency-dependent phase imbalance and the gain imbalance to at least one of the I- and Q-branch signals.

The invention provides a direct conversion receiver, including a receiver, a mixer, an analog-to-digital converter, a measuring unit, an estimator, and a compensator. The receiver receives a signal including multiple components at different receiving frequencies belonging to a frequency band. The mixer mixes each of the received signal components into a corresponding base band signal including I- and Q branches. The analog-to-digital converter converts the analog base band signal into a digital signal. The receiver also includes a measuring unit to measure power levels of the signal components in the digital signal in pairs, where one component in the pair belongs to an upper sideband of the frequency band and one component in the pair belongs to a lower sideband of the frequency band. The estimator estimates, when either the upper sideband component or the lower sideband component dominates in power over the component in the pair, a frequency-independent phase imbalance, a frequency-dependent phase imbalance and a gain imbalance. The compensator compensates the estimated frequency-independent phase imbalance, the frequency-dependent phase imbalance and the gain imbalance to at least one of the I- and Q-branch signals.

According to one embodiment, invention thus relates to direct-conversion receivers, where a received RF signal may be directly mixed into a base band signal without analog down-conversion to intermediate frequency (IF). The analog base band signal may thereafter be analog-to-digital converted. In the invention, the IQ-phase imbalance may be determined and the correction for the imbalance may be performed into a digital base band signal.

A multicarrier signal can be divided into pairs occupying the same (positive and negative) base band frequency bands as shown in FIG. 1A. For example, in situation of FIG. 1A, there are 6 carriers and correspondingly there are then 3 carrier pairs. According to one embodiment of the invention, power levels of the received signal components are measured and the estimation for the IQ imbalance are performed pair wise when and only when either the upper or the lower sideband signal component of the carrier pair dominates over the other component. Once estimation has been carried out, compensation can but does not need to be carried out when signals have comparable power.

Estimation for each pair can be carried out independently, i.e., estimation can be done for pair #1 if one of two carriers in it dominates, and likewise for pairs #2 and #3. In one embodiment, the I- and Q-signals may be transformed into frequency domain, and the estimation of IQ imbalance may be based on phase of the cross-spectrum of the transformed signals.

The inventive algorithm and apparatus can be implemented so that one of the signal branches, I and Q, is kept constant, and the phase imbalance is estimated in relation to the branch that is kept constant. In one embodiment, component-specific frequency-dependent phase imbalance estimates may be formed and the frequency-independent phase imbalance may be estimated as average of the component-specific estimates. In one embodiment, the frequency-dependent phase imbalance is estimated as half of the difference between the component-specific, frequency-dependent phase imbalance estimates.

According to one embodiment of the invention, the gain imbalance and the frequency-dependent phase imbalance may be compensated for by digital filtering, and a frequency-independent phase error may be removed by subtracting one of the suitably weighted signal branches I and Q from the other branch signal.

The invention can in an advantageous manner compensate for the frequency-dependent IQ imbalance thus reducing disadvantages of IQ cross talk.

BRIEF DESCRIPTION OF THE DRAWINGS

In the following, the invention will be described in greater detail with reference to the preferred embodiments and the accompanying drawings, in which

FIG. 2A shows one embodiment of the method according to the invention;

FIG. 2B specifies the method disclosed in FIG. 2A; and

DETAILED DESCRIPTION OF THE PREFERRED EMBODIMENTS

Figure 1A:
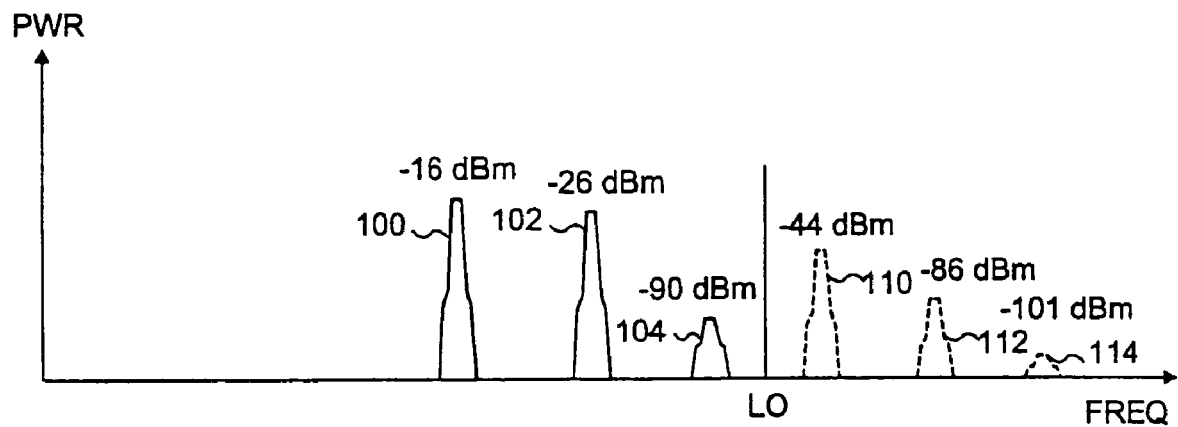
FIG. 1A illustrates reception of a multicarrier signal.
Figure 1B:
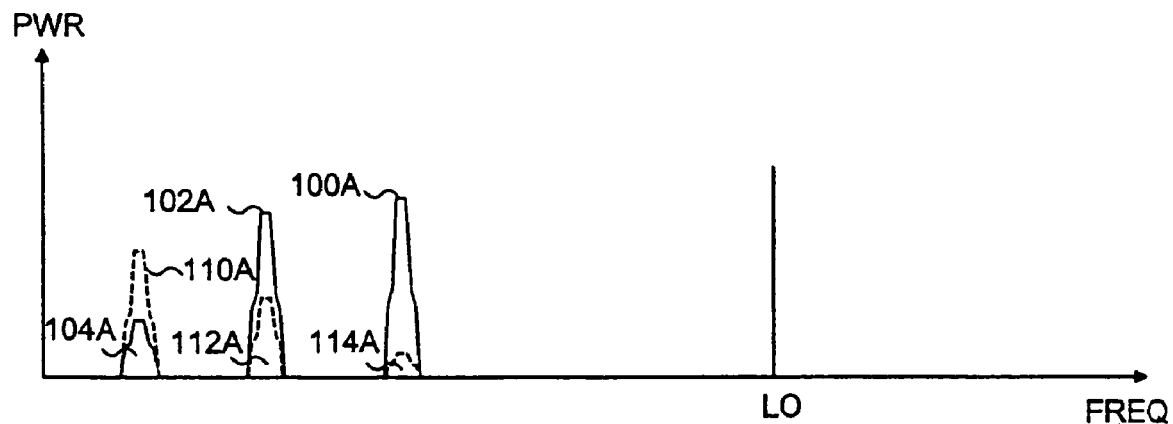
FIG. 1B shows the effect of the image signals in the frequency domain.

The embodiments of the invention can be applied in any data transmission system employing direct conversion receivers. Examples of such systems include Wireless LANs, UMTS and GSM. A direct conversion receiver is a receiver where a received radio frequency (RF) signal is converted directly to a base band frequency without any intermediate frequency (IF) conversion in between.

FIGS. 2A and 2B disclose one embodiment of the method according to the invention. In FIG. 2A step 200, a signal having multiple frequency components is received. The signal can thus originate from a single source or can contain multiple carriers from independent sources. The IQ imbalance problem will here be explained using dual-carrier scenario as an example. However, both the problem and the compensation algorithm can be straightforwardly generalized to scenarios with more than two carriers.

The terms $v_{I1}(t)$ and $v_{Q1}(t)$ denote the base band in-phase and quadrature-phase components of the signal 1, respectively, and the terms $v_{I2}(t)$ and $v_{Q2}(t)$ represent the respective components of the signal 2. The frequency bands of the signals may be located symmetrically around the local oscillator (LO) frequency $f_{LO}$. The carrier 1 has thus the frequency $f_{LO}+f_0$ and the carrier 2 has the frequency $f_{LO}-f_0$.

In the receiving step 200, the dual-carrier signal entering the RF port of the receiver further goes through a bandpass filter and a low-noise amplifier. Then the signal is down-converted, that is, mixed into base band signal in a quadrature demodulator according to step 202. The resulting I- and Q-branch signals can be low-pass filtered, amplified, and converted into a digital signal according to step 204. If the receiver is ideal, the signals $v_I(t)$ and $v_Q(t)$ in the output of the ADC's (Analog-to-Digital Converter) have the form shown by Equations (1):

$$i(t)=[v_{I1}(t)+v_{I2}(t)]\cos(2\pi f_0 t)-[v_{Q1}(t)-v_{Q2}(t)]\sin(2\pi f_0 t)$$

$$q(t)=[v_{I1}(t)-v_{I2}(t)]\sin(2\pi f_0 t)+[v_{Q1}(t)+v_{Q2}(t)]\cos(2\pi f_0 t) \quad \text{Equations (1)}$$

For clarity of the presentation, phase offset between the RF signal and the LO may be ignored as being irrelevant. To resolve the signals 1 and 2, the digital signals i(t) and q(t) may be subjected to another quadrature down-conversion, in which they are mixed with signals $\cos(2\pi f_0 t)$ and $\sin(2\pi f_0 t)$. Lowpass-filtering the mixing products and combining them appropriately yields the desired signals $v_{I1}(t)$, $v_{Q1}(t)$, $v_{I2}(t)$ and $v_{Q2}(t)$.

The receiver now has some IQ imbalance. Part of the imbalance arises from the I- and Q-branch LO signals differing from perfect phase quadrature. In this discussion, the imbalance is called frequency-independent phase imbalance. In addition to the frequency-independent phase imbalance, there may be frequency-dependent deviations in the gain and phase responses of the I- and Q-branch mixers, low-pass filters, and other analog components. Without loss of generality, one may take the Q-branch of the receiver as reference and assume that all nonideality occurs in the I-branch only.

In FIG. 2A in step 206, powers of signal components are measured. In step 208, powers of the signal components on the opposite sides of the LO frequency may be pair-wise compared to each other. When one of the signal components in the pair dominates in power over the other signal component in the pair, the method then estimates the phase and gain imbalance according to step 210. The estimation provides the correcting step 212 with correction factors to correct the phase and gain imbalance.

FIG. 2B specifies the estimating and correcting steps of FIG. 2A according to one embodiment of the invention. For analysis purposes, it is more convenient to express the signals in frequency domain, the transformation from time to frequency domain being performed in step 210A. The transformation can be performed e.g. with Fast Fourier transform or discrete Fourier transform.

Let I(f) and Q(f) denote the Fourier transforms of the ideal signals i(t) and q(t); and let X(f) and Y(f), shown by Equations (2), denote the corresponding signals in the presence of IQ imbalance $$X(f) = \Delta g(f) \exp(j\phi(f)) \{\cos(\delta) I(f) + \sin(\delta) Q(f)\},$$

$$Y(f) = Q(f). \quad \text{Equations (2)}$$

Here, $\Delta g(f)$ and $\phi(f)$ denote, respectively, gain and phase imbalance as functions of frequency, and $\delta$ represents the phase error between the I- and Q-branch LO signals. When the signals X(f) and Y(f) are subjected to digital down-conversion, the outcome is not only signals 1 and 2. In addition, an image of the signal 1 appears in signal 2 and vice versa. The strengths of the image signals may depend on the degree of the imbalance and on the strengths of the signals.

Note that steps 210A-210D are not limited to the order of steps but on the contrary, these steps can be performed in any order. In the following discussion, the above mentioned dual-carrier scenario is still used as an example. However, the method can be straightforwardly generalized to situations with more than two carriers.

Referring to the IQ imbalance given in Equation (2), it can be seen that if the IQ imbalance parameters $\delta$, $\Delta g(f)$ and $\phi(f)$ are known, estimates I'(f) and Q'(f) for the desired signals I(f) and Q(f), respectively, can be computed from the measured signals X(f) and Y(f) as shown by Equations (3)

$$I'(f) = \exp(-j\phi(f))/(\cos(\delta)\Delta g(f))X(f) - \tan(\delta)Y(f),$$

$$Q'(f) = Y(f). \quad \text{Equations (3)}$$

In method step 210B, frequency-dependent phase imbalance $\phi(f)$ may be estimated. The estimation may be implemented from the complex-valued frequency-domain signals X(f) and Y(f). Consider a dual-carrier signal of the form (1). The base band signal components $v_{I1}(t)$, $v_{Q1}(t)$, $v_{I2}(t)$ and $v_{Q2}(t)$ forming the dual-carrier signal are assumed to be noise-like in the sense that their Fourier-transforms, $v_{I1}(f)$, $v_{Q1}(f)$, $v_{I2}(f)$ and $v_{Q2}(f)$, respectively, satisfy Equations (4)

$$<V_{Ia}(f)V_{Ib}(f)> = 0, \text{ where } a=1, 2 \text{ and } b=1,2,$$

$$<V_{Ia}(f)V_{Qb}(f)> = 0, \text{ where } a=1, 2 \text{ and } b=1,2,$$

$$<V_{Qa}(f)V_{Qb}(f)> = 0, \text{ where } a=1, 2 \text{ and } b=1,2. \quad \text{Equations (4)}$$

Here, notation $<Z>$ denotes the expectation value of the quantity Z, evaluated in practice by averaging the values of Z over several sets of data. Moreover, assume that the signals 1 and 2 are independent, in the sense that they satisfy Equation (5)

$$<V_{a1}(f)V_{b2}^*(f)> = 0, \text{ where } a=I, Q \text{ and } b=I, Q. \quad \text{Equation (5)}$$

Here, the asterisk * denotes a complex conjugation. The in-phase and quadrature-phase components $v_{I1}(t)$ and $v_{Q1}(t)$ of the signal 1 are not required to be uncorrelated, neither are the components of the signal 2. With some algebraic manipulation, it can be shown that Equation 6 (Equation 6, continues on two lines) applies $$<X(f)Y^*(f)> = j\frac{1}{4}\Delta g(f) \exp(j\phi(f)) \times$$

$$(\exp(-j\delta)(S_1(f_0+f) + S_2(f-f_0)) - \exp(j\delta)(S_1(f-f_0) + S_2(f_0+f))). \quad \text{Equation (6)}$$

Equation (7) shows $S_1(f)$ and $S_2(f)$ respectively denoting the spectra of the signals 1 and 2:

$$S_a(f) = <(V_{Ia}(f) + jV_{Qa}(f))(V_{Ia}(f) + jV_{Qa}(f))^*> \quad \text{Equation (7)}$$

where a=1,2.

Assuming that spectra are sufficiently band-limited, the following Equation (8) applies:

$$<X(f_0+f)Y^*(f_0+f)> \approx j\frac{1}{4}\Delta g(f_0+f)\exp(j\delta(f_0+f))(\exp(-j\delta)S_2(f) - \exp(j\delta)S_1(f)). \quad \text{Equation (8)}$$

Consequently, the signal 1 with RF carrier at frequency $f_{LO}+f_0$, may experience an effective phase imbalance $\phi_1(f)$, whereas the signal 2, with RF carrier frequency $f_{LO}-f_0$, experiences an effective phase imbalance $\phi_2(f)$, the phase imbalances are shown by Equations (9)

$$\phi_1(f) = \delta + \Phi(f),$$

$$\phi_2(f) = \delta - \Phi(f). \quad \text{Equations (9)}$$

Hence, the estimation of the phase imbalance from the phase of the averaged quantity $<X(f)Y^*(f)>$ yields considerable advantages. Because of averaging, the phase of cross-products of signals satisfying Equations (4) and (5) may oscillate randomly and rapidly vanish, leaving only contributions proportional to the spectrum of the signals to remain, as shown in Equation (8). Consequently, the correlation between the I- and Q-components of signal 1 or those of signal 2 may only affect the spectrum of those signals and does not influence the phases. Moreover, since the phase of the terms proportional to the spectrum of signals 1 and 2 are independent of the exact shape of the spectra, the signals themselves do not need to be known and the estimation is blind. The algorithm does not require pilot signals or decision-aided feedback. Finally, the phase of the quantity $<X(f)Y^*(f)>$ directly yields phase imbalance data in Fourier domain. Hence, it is not necessary to use loops in time domain, and the method converges remarkably rapidly. A secondary algorithm may be needed to separate the frequency independent and frequency dependent contribution. Several methods to accomplish this separation may be included in this invention.

For example, when both signals 1 and 2 are present, the phase of the averaged quantity $<X(f)Y^*(f)>$ may depend on the relative strengths of the signals. However, under the condition that either $S_1(f) \gg S_2(f)$ or $S_2(f) \gg S_1(f)$, the phase of the averaged quantity $<X(f)Y^*(f)>$ directly yields either the quantity $\phi_1(f)$ or the quantity $\phi_2(f)$. Referring back to FIG. 2A and steps 206 and 208 the phase imbalance is estimated from the phase of the averaged quantity $<X(f)Y^*(f)>$ only when one of the signals in the signal component pair dominates in receiving power over the other one. In optimal conditions the dominating signal alternates over a reasonable measuring period, i.e., signal 1 may dominate part of the time and signal 2 may dominate part of the time. In such conditions, estimates may be obtained for both quantities $\phi_1(f)$ and $\phi_2(f)$. Referring again to FIG. 2B and step 210C, the phase error between I and Q LO-signals $\delta$, that is, the frequency independent phase error, can be estimated according to Equation (10) as an average $$\delta = (\phi_1(f) + \phi_2(f))/2 \quad \text{Equation (10)}$$

over the frequency band of interest, and frequency-dependent phase error $\Phi(f)$ of step 210B can be estimated according to Equation (11)

$$\Phi(f) = (\phi_1(f) - \phi_2(f))/2. \quad \text{Equation (11)}$$

Alternatively, for example polynomial fitting methods can be used to extract the imbalances from either quantity $\phi_1(f)$ or $\phi_2(f)$ alone.

One approach to achieve the desired alternation in the relative signal powers is to use the RF test loop. In unit testing/calibration stage, signals generated by the RF test loop can be used to achieve initial values for the imbalance. During operation, if there are time periods when only one of the signals is being received, the RF test loop may be used to generate the other signal for imbalance estimation purposes.

The method can be straightforwardly generalized to cases with more than two carriers. It may then be required that the phase imbalance is estimated only when each frequency band of interest is dominated by only one of the two possible carriers that can occupy that particular frequency band. Decomposition into frequency-dependent and frequency-independent imbalance contribution is then straightforward.

Estimation of gain imbalance $\Delta g(f)$ as shown by step 210D, can be estimated with some prior art method utilizing the signals from ADCs to obtain frequency-domain signals X(f) and Y(f) by Fourier transform according to step. As a result of the Fourier transform, the amplitude levels of each frequency component are determined. Initially, both I- and Q-branch contain both sidebands but with different phases. In the average, the I- and Q-branches have the same power, if both branches are identical. The ratio of the amplitude averages at each frequency point of the I- and Q-branches may reveal the frequency dependent gain difference between the I- and Q-branch of the receiver.

Method steps 210B-210D presented above contribute to the determination of, according to step 210E, the desired signals presented by equations (3). As a practical realization, e.g. a digital equalizer such as a FIR (Finite Impulse Response) filter can be realized so that its frequency response matches the inverse imbalance $\exp(-j\Phi(f))/(\cos(\delta)\Delta g(f))$. The accuracy of the correction depends on the accuracy of the estimated imbalance parameters. Hence, the algorithm for imbalance estimation may be of crucial importance.

Step 212A uses an equalizer to compensate the gain imbalance and frequency-dependent phase imbalance. As a second correction step, second correction step 212B is introduced, where correction may be performed with a subtraction element compensating the frequency-independent phase imbalance. Tunable delay elements can be added to control overall delay between the I- and Q-branches and to alleviate the filter synthesis.

An alternative solution, in comparison to the one disclosed above, is, not to use delay elements but, instead, to carry out the correction to either I- or Q-branches according to which branch has a shorter delay.

The inventive idea can also be implemented so that LO phase error is compensated by introducing an opposite phase imbalance into the digital oscillator in the base band double quadrature stage which follows the compensation stage.

Figure 3:
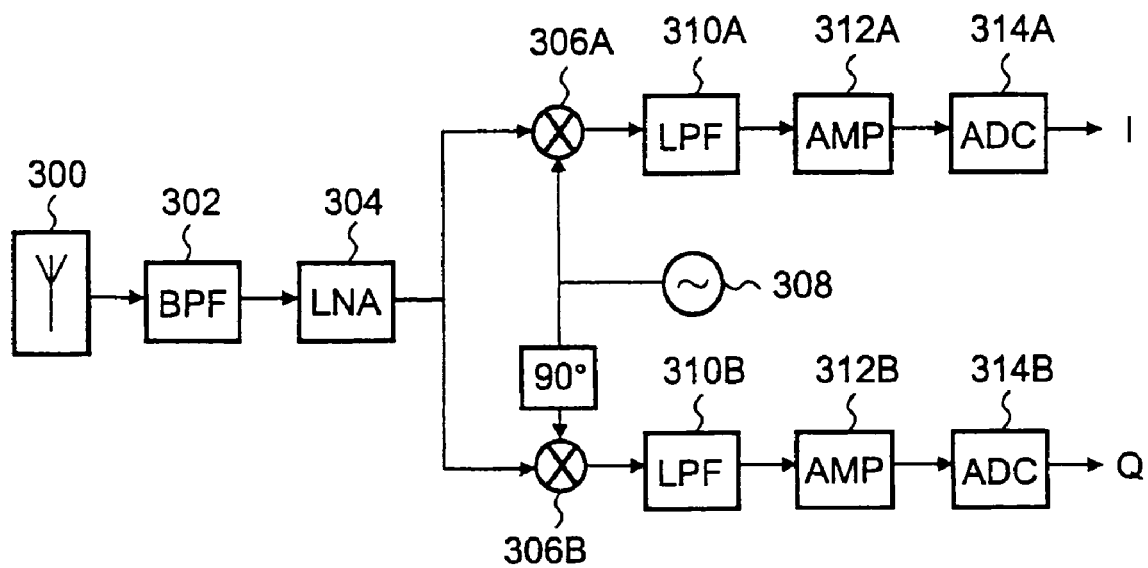
FIG. 3 illustrates an example of a direct conversion receiver according to an embodiment of the invention.
Figure 3:
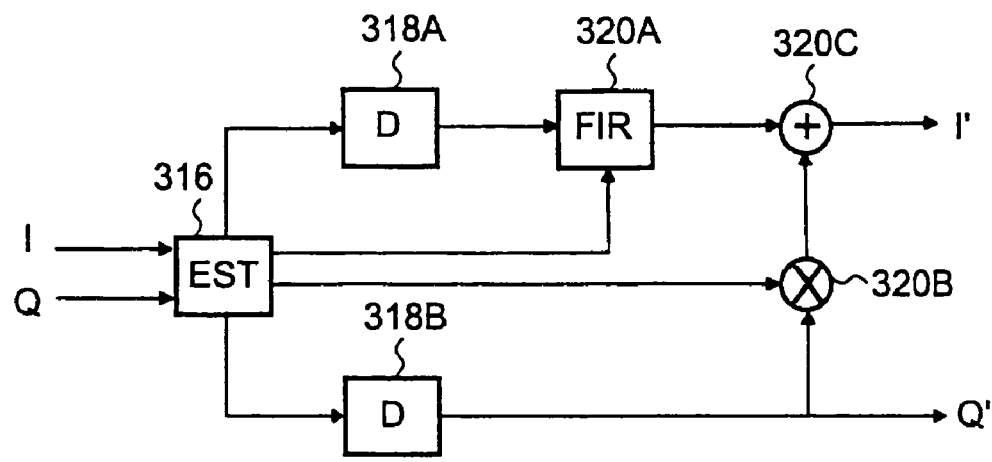

FIG. 3 illustrates an example of a receiver according to the invention. The receiver includes a receiving device 300 that includes an antenna, whereby a radio frequency signal from a transmitter is received. The received signal may be band pass filtered in a filter 302 and amplified in a low noise amplifier 304. Then, the signal may be mixed directly into the base band frequency in mixers 306A-306B where local oscillator 308 provides the RF signal used in the mixing. After the mixing process, an analog complex signal $s(t) = I(t) + jQ(t)$, having approximately 90 degrees phase difference between the signal branches, is available. The I- and Q-components may be passed to corresponding analog low pass filters 310A-310B and a base band amplifiers 312A-312B. The signals may then be converted into digital signals in a converting device, that is, A/D converters 314A-314B. These receiver components are all known to one skilled in the art.

In multicarrier systems, IQ phase errors have a significant impact on the signal performance, compared with single carrier radios. It may therefore be important to eliminate the IQ phase imbalance in the receiver as early as possible. In the embodiment illustrated by the receiver of FIG. 3, an IQ phase imbalance estimation block 316 may follow directly after the A/D converters 314A-314B. The signal may then be processed by tunable delay elements 318A-318B to control overall delay between the I- and Q-branches and to alleviate the filter synthesis. In the estimation block 316, frequency-dependent phase imbalance $\Phi(f)$, frequency-independent phase imbalance $\delta$ and gain imbalance $\Delta g(f)$ are estimated. FIG. 3 shows one example to correct the estimated factors of the total IQ imbalance. The receiver may contain a compensating device, which includes a first correcting device 320A such as a FIR filter to compensate for the frequency-dependent phase imbalance $\Phi(f)$ and the gain imbalance $\Delta g(f)$. The compensating device further contains a subtraction element 320B-320C to subtract the frequency-independent phase imbalance $\delta$ to obtain the compensated signals I'(f) and Q'(f) in equations (3).

The invention can be realized as a DSP (Digital Signal Processing) algorithm. For example, the invention can be implemented together with the other RF-related DSP functions, such as digital down-conversion, filtering and scaling. For example, ASIC (Application Specific Integrated Circuit), FPGA (Field Programmable Gate Arrays) or processor-based approaches can be used.

Even though the invention has been described above with reference to an example according to the accompanying drawings, it is clear that the invention is not restricted thereto but can be modified in several ways within the scope of the appended claims.

The invention claimed is:

1. A receiving method in a direct conversion receiver, the method comprising:
    receiving a signal comprising multiple components at different receiving frequencies belonging to a frequency band;
    mixing at least one of the received signal components into a corresponding base band signal comprising I- and Q branches;
    converting the analog base band signal into a digital signal;
    measuring power levels of the signal components in the digital signal in pairs, where a first component in a pair belongs to an upper sideband of the frequency band and a second component in the pair belongs to a lower sideband of the frequency band;

estimating, when either the upper sideband component or the lower sideband component dominates in power over another component in the pair, a frequency-independent phase imbalance, a frequency-dependent phase imbalance and a gain imbalance;

compensating the estimated frequency-independent phase imbalance, the frequency-dependent phase imbalance and the gain imbalance to at least one of the I- and Q-branch signals wherein the estimating further comprises transforming the I- and Q-signals into frequency domain using a discrete Fourier transform or a fast Fourier transform to provide signals $X(f)$ and $Y(f)$; and estimating the frequency-dependent phase imbalance and the frequency-independent phase imbalance from the phase of the cross-spectrum $(X(f)Y^*(f))$, wherein $X(f)$ and $Y(f)$ denote the corresponding base band signals.

2. A receiving method in a direct conversion receiver, the method comprising:

receiving a signal comprising multiple components at different receiving frequencies belonging to a frequency band;

mixing at least one of the received signal components into a corresponding base band signal comprising I- and Q branches;

converting the analog base band signal into a digital signal;

measuring power levels of the signal components in the digital signal in pairs, where a first component in a pair belongs to an upper sideband of the frequency band and a second component in the pair belongs to a lower sideband of the frequency band;

estimating, when either the upper sideband component or the lower sideband component dominates in power over another component in the pair, a frequency-independent phase imbalance, a frequency-dependent phase imbalance and a gain imbalance;

compensating the estimated frequency-independent phase imbalance, the frequency-dependent phase imbalance and the gain imbalance to at least one of the I- and Q-branch signals wherein the estimating further comprises transforming the I-and Q-signals into frequency domain using a discrete Fourier transform or a fast Fourier transform to provide signals $X(f)$ and $Y(f)$; and estimating the frequency-dependent phase imbalance and the frequency-independent phase imbalance from the phase of the cross-spectrum $(X(f)Y^*(f))$, wherein $X(f)$ and $Y(f)$ denote the corresponding base band signals, wherein the estimating comprises estimating the frequency-dependent phase imbalance and the frequency-independent phase imbalance from the phase of the averaged cross-spectrum $<X(f)Y^*(f)>$.

3. A receiving method in a direct conversion receiver, the method comprising:

receiving a signal comprising multiple components at different receiving frequencies belonging to a frequency band;

mixing at least one of the received signal components into a corresponding base band signal comprising I- and Q branches;

converting the analog base band signal into a digital signal;

measuring power levels of the signal components in the digital signal in pairs, where a first component in a pair belongs to an upper sideband of the frequency band and a second component in the pair belongs to a lower sideband of the frequency band;

estimating, when either the upper sideband component in the pair, a frequency-independent phase imbalance, a frequency-dependent phase imbalance and a gain imbalance;

compensating the estimated frequency-independent phase imbalance, the frequency-dependent phase imbalance and the gain imbalance to at least one of the I- and Q-branch signals, wherein the estimating comprises estimating signal component-specific frequency-dependent phase imbalances when either the upper or the lower sideband signal component present in the pair dominates in power over the another component, and estimating the frequency-independent phase imbalance as an average over the component-specific frequency-dependent phase imbalances.

4. A receiving method in a direct conversion receiver, the method comprising:

receiving a signal comprising multiple components at different receiving frequencies belonging to a frequency band;

mixing at least one of the received signal components into a corresponding base band signal comprising I- and Q branches;

converting the analog base band signal into a digital signal;

measuring power levels of the signal components in the digital signal in pairs, where a first component in a pair belongs to an upper sideband of the frequency band and a second component in the pair belongs to a lower sideband of the frequency band;

estimating, when either the upper sideband component or the lower sideband component dominates in power over another component in the pair, a frequency-independent phase imbalance, a frequency-dependent phase imbalance and a gain imbalance;

compensating the estimated frequency-independent phase imbalance, the frequency-dependent phase imbalance and the gain imbalance to at least one of the I- and Q-branch signals, wherein the estimating comprises estimating signal component-specific frequency-dependent phase imbalance factors when either the upper or the lower sideband signal component in the pair dominates in power over the another component; and estimating the frequency-dependent phase imbalance as half of a difference between the component-specific frequency-dependent phase imbalance factors.

5. A receiving method in a direct conversion receiver, the method comprising:

receiving a signal comprising multiple components at different receiving frequencies belonging to a frequency band;

mixing at least one of the received signal components into a corresponding base band signal comprising I- and Q branches;

converting the analog base band signal into a digital signal;

measuring power levels of the signal components in the digital signal in pairs, where a first component in a pair belongs to an upper sideband of the frequency band and a second component in the pair belongs to a lower sideband of the frequency band;

estimating, when either the upper sideband component or the lower sideband component dominates in power over another component in the pair, a frequency-independent phase imbalance, a frequency-dependent phase imbalance and a gain imbalance;

compensating the estimated frequency-independent phase imbalance, the frequency-dependent phase imbalance and the gain imbalance to at least one of the I- and Q-branch signals, wherein the estimating comprises estimating signal component-specific frequency-dependent phase imbalances when either the upper or the lower sideband signal component of the pair dominates in power over the another component; and estimating the frequency-independent phase imbalance from one or several of the component-specific frequency-dependent phase-imbalances by fining techniques.

6. The method of claim 1, wherein the compensating comprises compensating for the frequency-dependent phase imbalance and for the gain imbalance by digital filtering.

7. A receiving method in a direct conversion receiver, the method comprising:

receiving a signal comprising multiple components at different receiving frequencies belonging to a frequency band;

mixing at least one of the received signal components into a corresponding base band signal comprising I- and Q branches;

converting the analog base band signal into a digital signal;

measuring power levels of the signal components in the digital signal in pairs, where a first component in a pair belongs to an upper sideband of the frequency band and a second component in the pair belongs to a lower sideband of the frequency band;

estimating, when either the upper sideband component or the lower sideband component dominates in power over another component in the pair, a frequency-independent phase imbalance, a frequency-dependent phase imbalance and a gain imbalance;

compensating the estimated frequency-independent phase imbalance, the frequency-dependent phase imbalance and the gain imbalance to at least one of the I- and Q-branch signals, wherein the compensating comprises compensating for the frequency-dependent phase imbalance and for the gain imbalance by digital filtering, wherein the compensating comprises compensating for the frequency-independent phase imbalance by subtracting the frequency independent phase imbalance from the outcome of the digital filtering.

8. A direct conversion receiver, comprising:

receiving means for receiving a signal comprising multiple components at different receiving frequencies belonging to a frequency band;

mixing means for mixing at least one of the received signal components into a corresponding base band signal comprising I- and Q branches;

converting means for converting the analog base band signal into a digital signal;

measuring means for measuring power levels of the signal components in the digital signal in pairs, where a first component in a pair belongs to an upper sideband of the frequency band and a second component in the pair belongs to a lower sideband of the frequency band;

estimating means for estimating, when either the upper sideband component or the lower sideband component dominates in power over another component in the pair, a frequency-independent phase imbalance, a frequency-dependent phase imbalance and a gain imbalance; and compensating means for compensating the estimated frequency-independent phase imbalance, the frequency-dependent phase imbalance and the gain imbalance to at least one of the I- and Q-branch signals wherein the estimating means is configured to transform the I- and Q-signals into frequency domain using discrete Fourier transform or fast Fourier transform to provide signals $X(f)$ and $Y(f)$; and estimate the frequency-dependent phase imbalance and the frequency-independent phase imbalance from the phase of the cross-spectrum $(X(f)Y^*(f))$, wherein $X(f)$ and $Y(f)$ denote the corresponding base band signals.

9. A direct conversion receiver, comprising:

a receiver configured to receive a signal comprising multiple components at different receiving frequencies belonging to a frequency band;

a mixer configured to mix at least one of the received signal components into a corresponding base band signal comprising I- and Q branches;

a converter configured to convert the analog base band signal into a digital signal;

a measuring unit configured to measure power levels of the signal components in the digital signal in pairs, where a first component in a pair belongs to an upper sideband of the frequency band and a second component in the pair belongs to a lower sideband of the frequency band;

an estimator configured to estimate, when either the upper sideband component or the lower sideband component dominates in power over another component in the pair, a frequency-independent phase imbalance, a frequency-dependent phase imbalance and a gain imbalance; and a compensator configured to compensate the estimated frequency-independent phase imbalance, the frequency-dependent phase imbalance and the gain imbalance to at least one of the I- and Q-branch signals wherein the estimator is configured to transform the I- and Q-signals into frequency domain using discrete Fourier transform or fast Fourier transform to provide signals $X(f)$ and $Y(f)$; and estimate the frequency-dependent phase imbalance and the frequency-independent phase imbalance from the phase of the cross-spectrum $(X(f)Y^*(f))$, wherein $X(f)$ and $Y(f)$ denote the corresponding base band signals, wherein the estimator is configured to estimate the frequency-dependent phase imbalance and the frequency-independent phase imbalance from the phase of the averaged cross-spectrum $<X(f)Y^*(f)>$.

10. A direct conversion receiver, comprising:
a receiver configured to receive a signal comprising multiple components at different receiving frequencies belonging to a frequency band;
a mixer configured to mix at least one of the received signal components into a corresponding base band signal comprising I- and Q branches;
a converter configured to convert the analog base band signal into a digital signal;
a measuring unit configured to measure power levels of the signal components in the digital signal in pairs, where a first component in a pair belongs to an upper sideband of the frequency band and a second component in the pair belongs to a lower sideband of the frequency band;
an estimator configured to estimate, when either the upper sideband component or the lower sideband component dominates in power over another component in the pair, a frequency-independent phase imbalance, a frequency-dependent phase imbalance and a gain imbalance; and
a compensator configured to compensate the estimated frequency-independent phase imbalance, the frequency-dependent phase imbalance and the gain imbalance to at least one of the I- and Q-branch signals,
wherein the estimator is configured to
estimate signal component-specific frequency-dependent phase imbalances when either upper- or lower sideband signal component present in the pair dominates in power over the another component; and
estimate the frequency-independent phase imbalance as an average over the component-specific frequency-dependent phase imbalances.

11. A direct conversion receiver, comprising:
a receiver configured to receive a signal comprising multiple components at different receiving frequencies belonging to a frequency band;
a mixer configured to mix at least one of the received signal components into a corresponding base band signal comprising I- and Q branches;
a converter configured to convert the analog base band signal into a digital signal;
a measuring unit configured to measure power levels of the signal components in the digital signal in pairs, where a first component in a pair belongs to an upper sideband of the frequency band and a second component in the pair belongs to a lower sideband of the frequency band;
an estimator configured to estimate, when either the upper sideband component or the lower sideband component dominates in power over another component in the pair, a frequency-independent phase imbalance, a frequency-dependent phase imbalance and a gain imbalance; and
a compensator configured to compensate the estimated frequency-independent phase imbalance, the frequency-dependent phase imbalance and the gain imbalance to at least one of the I- and Q-branch signals,
wherein the estimator is configured to
estimate signal component-specific frequency-dependent phase imbalance factors when either the upper- or the lower sideband signal component in the pair dominates in power over the another component; and
estimate the frequency-dependent phase imbalance as a half of the difference between the component-specific frequency-dependent phase imbalance factors.

12. A direct conversion receiver, comprising:
a receiver configured to receive a signal comprising multiple components at different receiving frequencies belonging to a frequency band;
a mixer configured to mix at least one of the received signal components into a corresponding base band signal comprising I- and Q branches;
a converter configured to convert the analog base band signal into a digital signal;
a measuring unit configured to measure power levels of the signal components in the digital signal in pairs, where a first component in a pair belongs to an upper sideband of the frequency band and a second component in the pair belongs to a lower sideband of the frequency band;
an estimator configured to estimate, when either the upper sideband component or the lower sideband component dominates in power over another component in the pair, a frequency-independent phase imbalance, a frequency-dependent phase imbalance and a gain imbalance; and
a compensator configured to compensate the estimated frequency-independent phase imbalance, the frequency-dependent phase imbalance and the gain imbalance to at least one of the I- and Q-branch signals,
wherein the estimator is configured to
estimate signal component-specific frequency-dependent phase imbalances when either the upper- or the lower sideband signal component of the pair dominates in power over the another component; and
estimate the frequency-independent phase imbalance from one or several of the component-specific frequency-dependent phase-imbalances by fining techniques.

13. The direct conversion receiver of claim 8, wherein the compensating means is configured to:
compensate for the frequency-dependent phase imbalance and for the gain imbalance by digital filtering.

14. A direct conversion receiver, comprising:
a receiver configured to receive a signal comprising multiple components at different receiving frequencies belonging to a freqiuency band;
a mixer configured to mix at least one of the received signal components into a corresponding base band signal comprising I- and Q branches;
a converter configured to convert the analog base band signal into a digital signal;
a measuring unit configured to measure power levels of the signal components in the digital signal in pairs, where a first component in a pair belongs to an upper sideband of the freqiuency band and a second component in the pair belongs to a lower sideband of the frequency band;
an estimator configured to estimate, when either the upper sideband component or the lower sideband component dominates in power over another component in the pair, a frequency-independent phase imbalance, a freqiuency-dependent phase imbalance and a gain imbalance; and
a compensator configured to compensate the estimated frequency-independent phase imbalance, the frequency-dependent phase imbalance and the gain imbalance to at least one of the I- and Q-branch signals,
wherein the compensator is configured to compensate for the frequency-dependent phase imbalance and for the gain imbalance by digital filtering, wherein the compensator if configured to compensate for the frequency-independent phase imbalance by subtracting the frequency independent phase imbalance from the outcome of the digital filtering.

15. A direct conversion receiver, comprising:
a receiver configured to receive a signal comprising multiple components at different receiving frequencies belonging to a frequency band;
a mixer configured to mix at least one of the received signal components into a corresponding base band signal comprising I- and Q branches;
an analog-to-digital converter configured to convert the analog base band signal into a digital signal;
wherein the receiver comprises
a measuring unit configured to measure power levels of the signal components in the digital signal in pairs, where a first component in the pair belongs to an upper sideband of the frequency band and a second component in the pair belongs to a lower sideband of the frequency band;
an estimator configured to estimate, when either the upper sideband component or the lower sideband component dominates in power over another component in the pair, a frequency-independent phase imbalance, a frequency-dependent phase imbalance and a gain imbalance; and
a compensator configured to compensate the estimated frequency-independent phase imbalance, the frequency-dependent phase imbalance and the gain imbalance to at least one of the I- and Q-branch signals;
wherein the estimator further comprises
a transformer configured to transform the I- and Q-signals into frequency domain using a discrete Fourier transform or a fast Fourier transform to provide signals $X(f)$ and $Y(f)$; and
an estimator configured to estimate the frequency-dependent phase imbalance and the frequency-independent phase imbalance from the phase of the cross-spectrum $(X(f)Y^*(f))$,
wherein $X(f)$ and $Y(f)$ denote the corresponding base band signals.

* * * * *